US009341684B2

(12) United States Patent
Sidman

(10) Patent No.: US 9,341,684 B2
(45) Date of Patent: May 17, 2016

(54) MAGNETIC FIELD SENSING APPARATUS AND METHODS

(71) Applicant: Alan L. Sidman, Shrewsbury, MA (US)

(72) Inventor: Alan L. Sidman, Shrewsbury, MA (US)

(73) Assignee: Plures Technologies, Inc., Canadaigua, NY (US)

( * ) Notice: Subject to any disclaimer, the term of this patent is extended or adjusted under 35 U.S.C. 154(b) by 184 days.

(21) Appl. No.: 14/190,388

(22) Filed: Feb. 26, 2014

(65) Prior Publication Data

US 2014/0266185 A1    Sep. 18, 2014

Related U.S. Application Data

(60) Provisional application No. 61/779,158, filed on Mar. 13, 2013.

(51) Int. Cl.
| | |
|---|---|
| *G01R 33/02* | (2006.01) |
| *G01R 33/09* | (2006.01) |
| *G01R 33/06* | (2006.01) |
| *G01R 33/00* | (2006.01) |

(52) U.S. Cl.
CPC ............ *G01R 33/06* (2013.01); *G01R 33/0005* (2013.01); *G01R 33/0011* (2013.01); *G01R 33/063* (2013.01); *G01R 33/093* (2013.01); *G01R 33/096* (2013.01); *G01R 33/098* (2013.01); *G01R 33/09* (2013.01)

(58) Field of Classification Search
CPC .............................. G01R 33/093; G01R 33/09
USPC .................................................. 324/252, 244
See application file for complete search history.

(56) References Cited

U.S. PATENT DOCUMENTS

| | | | |
|---|---|---|---|
| 6,121,862 A | 9/2000 | Von Eckroth et al. | |
| 6,633,462 B2 * | 10/2003 | Adelerhof ..................... 360/315 |
| 7,112,957 B2 | 9/2006 | Bicking | |
| 7,639,005 B2 | 12/2009 | Qian et al. | |
| 2002/0180433 A1 | 12/2002 | Van Zon et al. | |
| 2005/0073295 A1 | 4/2005 | Hastings et al. | |
| 2005/0280411 A1 | 12/2005 | Bicking | |
| 2006/0175674 A1 | 8/2006 | Taylor et al. | |
| 2010/0072992 A1 | 3/2010 | Bauer | |
| 2011/0244599 A1 | 10/2011 | Whig et al. | |

FOREIGN PATENT DOCUMENTS

| | | |
|---|---|---|
| WO | 99/22368 A2 | 5/1999 |
| WO | 2005064357 A2 | 7/2005 |
| WO | 2010098967 A1 | 9/2010 |

OTHER PUBLICATIONS

International Preliminary Report on Patentability from the International Searching Authority, date of mailing Sep. 24, 2015, from the Parent PCT/US2014/019379, filed on Feb. 28, 2014.
International Search Report dated Jun. 13, 2014 for PCT/US14/019379.

* cited by examiner

*Primary Examiner* — Reena Aurora
(74) *Attorney, Agent, or Firm* — Burns & Levinson LLP; Janine M. Susan; Orlando Lopez

(57) ABSTRACT

Magnetic field sensor designs that provide both increased directionality and proximate coupling desirable for improved directionality and sensitivity and methods for fabricating them.

34 Claims, 17 Drawing Sheets

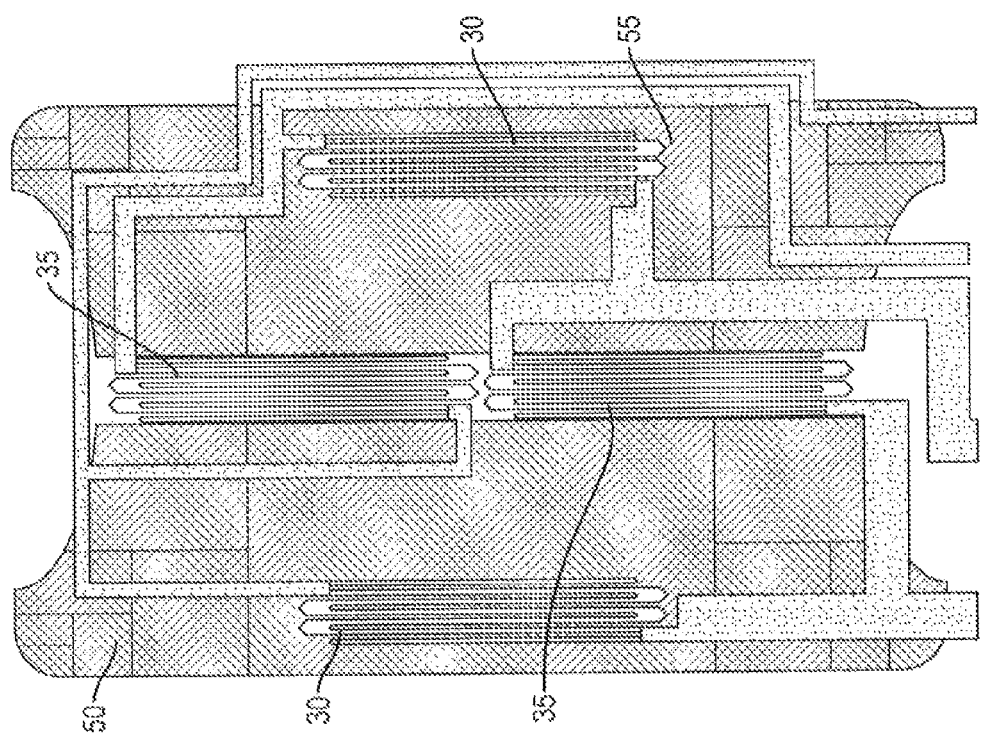

MAGNETIC FIELD SENSING APPARATUS AND METHODS

CROSS-REFERENCE TO RELATED APPLICATIONS

This application claims priority to and benefit from U.S. Provisional Application No. 61/779,158, filed Mar. 13, 2013, entitled MAGNETIC FIELD SENSING APPARATUS AND METHODS, which is incorporated herein by reference in its entirety for all purposes.

BACKGROUND

These teachings relate generally to magnetic field sensing, and, more particularly, to directional magnetic field sensing.

Magnetic field sensing is utilized in a wide array of end-applications including linear and rotary motion sensing, magnetic switches, current sensors, and compassing. These sensors find use in automotive, industrial, medical and consumer end-markets.

Magnetic field sensors may operate by inductive coupling or direct magnetic coupling between a localized magnetic or geomagnetic field and a ferromagnetic or semiconducting magnetic sensor material. These sensors may utilize a variety of sensing methods, including the Hall-effect, anisotropic, giant or tunneling magneto-resistive and magneto-impedance (MI) effects among others.

Sensors may be designed to couple to magnetic fields in a single orientation or in multiple orientations. Sensors may utilize ferromagnetic flux-concentrators to improve the coupling of external magnetic fields to the sensor. This increases the magnetic field injected into the sensor and boosts the sensor response.

The use of a single planar flux-concentrator to inject external magnetization into horizontal and vertical semiconductor Hall-effect magnetic sensors has been previously described as well as the use of a ring or disc shaped planar flux concentrator. The use of a planar flux concentrator and a MEMS electrostatic actuator to change the positional coupling of the flux-concentrator to the sensor, modulating the flux-coupling has also been previously described. The use of a flux-concentrator/flux-shield combination in a Wheatstone bridge sensor configuration, wherein two bridge resistor elements are shielded reference magneto-resistors and two bridge resistor elements are sensing magneto-resistors has been previously described. The (multilayer GMR) elements are differentially processed to obtain a net signal output. The flux-concentrator, in proximity to the ends of the magneto-resistor element, provides signal gain.

One drawback of each of these flux-concentrator designs is that they provide generalized magnetic field concentration with little specific vector selectivity. The round or disc-shaped flux concentrators collect magnetization from numerous or all vector orientations. While this does boost signal it does not boost specific vector orientation signals essential for many magnetic sensing applications.

Additionally, generalized proximity of the conventional flux-concentrator designs does not provide the maximum potential flux-coupling possible with fully proximate designs. Thus, maximum signal gain or increased sensitivity is not obtained with prior-art designs.

There is a need for designs that provide both increased directionality and proximate coupling desirable for improved directionality and sensitivity magnetic field sensors.

BRIEF SUMMARY

Embodiments of magnetic field sensor designs that provide both increased directionality and proximate coupling desirable for improved directionality and sensitivity and methods for fabricating them are disclosed herein below.

In one or more embodiments, the magnetic field sensing component of these teachings includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and a flux concentrating structure, the flux concentrating structure being disposed in a horizontal plane above the array of line elements and the first connecting elements and said second connecting elements. The flux concentrating structure includes a first end, a second end and a number of bars extending from the first end to the second end, each one bar being horizontally disposed between and substantially parallel to two line elements and a distance between the first end and the second end being longer than a longest distance between said first connecting elements and said second connecting elements.

In one or more embodiments, the sensor of these teachings includes two reference resistor elements and two magneto-resistor sensing elements. Each magneto-resistor sensing element includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure, a second flux concentrating/shielding structure, and a flux concentrating structure. The first flux concentrating/shielding structure is disposed over one of the two reference resistor elements in order to substantially shield said one reference resistor element from external fields; the second flux concentrating/shielding structure disposed over another of the two reference resistor elements in order to substantially shield the other reference resistor element from external fields. The two magneto-resistor sensing elements are disposed between the first concentrating/shielding structure and the second flux concentrating/shielding structure. The flux concentrating structure is disposed in a horizontal plane above the array of line elements from each of the two magneto-resistor sensing elements and the first connecting elements and the second connecting elements from each of the two magneto-resistor sensing elements. The flux concentrating structure includes a first end, a second end and a number of bars extending from either the first end or the second end. Each bar is horizontally disposed between and substantially parallel to two line elements from one of the two magneto-resistor sensing elements. A distance between the first end and the second end is longer than a longest distance between the first connecting elements and the second connecting elements from a first or second magneto-resistor sensing element.

The two reference resistor elements and the two magneto-resistor elements are connected to form a Wheatstone Bridge configuration, each of arm of the Wheatstone Bridge comprising one reference resistor and one magneto-resistor element. Output of the Wheatstone Bridge is provided by a voltage between points of connection of the reference resistor element and the magneto-resistor element in each arm of the Wheatstone Bridge.

In other embodiments, the sensor of these teachings includes two reference resistor elements and two magneto-resistor sensing elements. Each magneto-resistor sensing element includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure and a second flux concentrating/shielding structure. The first flux concentrating/shielding structure is disposed over one of the two reference resistor elements in order to substantially shield said one reference resistor element from external fields. The first flux concentrating/shielding structure includes a first end and a second end; the one reference resistor element being disposed between the first end and the second end. The second flux concentrating/shielding structure is disposed over another of the two reference resistor elements in order to substantially shield the other reference resistor element from external fields. The second flux concentrating/shielding structure has a third end and a fourth end. The other reference resistor element is disposed between the third end and the fourth end. The two magneto-resistor sensing elements are disposed between the first concentrating/shielding structure and the second flux concentrating/shielding structure so that each one of the two magneto resistor elements is adjacent to the first end of the first flux concentrating/shielding structure and each one of the two magneto resistor elements is adjacent to the third end of the second flux concentrating/shielding structure. Each line element from the array of line elements in each of the two magneto-resistor elements is substantially parallel to the first end the first flux concentrating/shielding structure and to the third end of the second flux concentrating/shielding structure.

The two reference resistor elements and the two magneto-resistor elements are connected to form a Wheatstone Bridge configuration, each of arm of the Wheatstone Bridge comprising one reference resistor and one magneto-resistor element. Output of the Wheatstone Bridge is provided by a voltage between points of connection of the reference resistor element and the magneto-resistor element in each arm of the Wheatstone Bridge.

One embodiment of the method for fabricating a magnetic field sensing component includes depositing a number of magnetic field sensing structures as line elements in an array of magnetic field sensing structures, patterning and depositing conductor elements to connect first and second ends of adjacent line elements; the connecting elements connecting the first and second ends of the adjacent line elements in order to form a substantially serpentine structure, depositing a dielectric layer to provide isolation between the magnetic field sensing structures, patterning and etching deposition vias in the dielectric layer and patterning and depositing a flux concentrator structure, the flux concentrator structure having a first end, a second end and a number of bars extending from the first end to the second end, each one bar being horizontally disposed between and substantially parallel to two line elements from one of the two magneto resistor sensing elements. A distance between the first end and the second end is longer than a longest distance between the first connecting elements and the second connecting elements from a first or second magneto-resistor sensing element.

A number of other embodiments are also disclosed.

For a better understanding of the present teachings, together with other and further objects thereof, reference is made to the accompanying drawings and detailed description and its scope will be pointed out in the appended claims.

BRIEF DESCRIPTION OF THE DRAWINGS

FIGS. 1e and 1f depict another embodiment of the sensor of these teachings as viewed in two orientations;

DETAILED DESCRIPTION

Figure 1A:
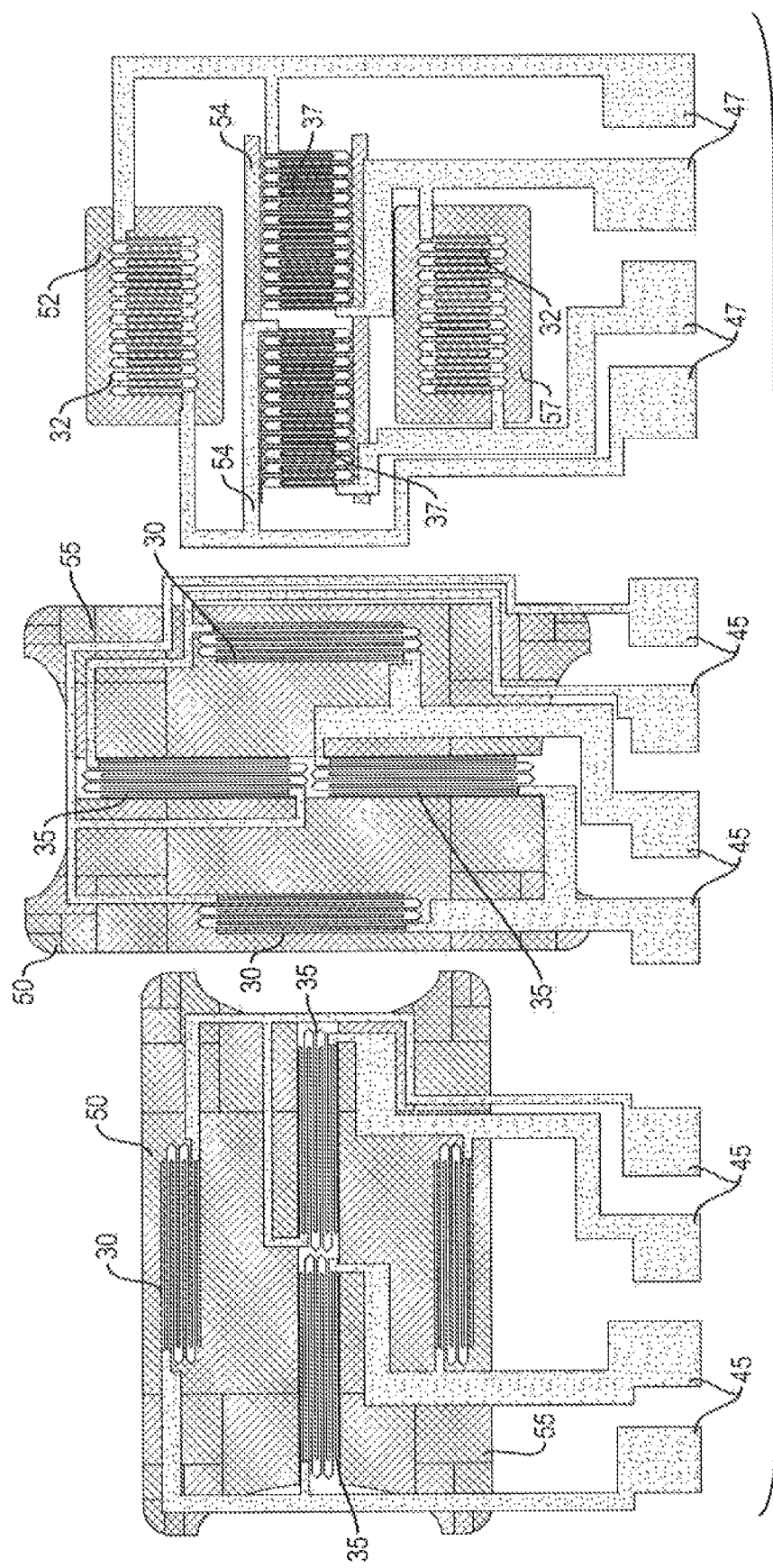
FIG. 1a depicts one embodiment of the system of these teachings.

The following detailed description is of the best currently contemplated modes of carrying out these teachings. The description is not to be taken in a limiting sense, but is made merely for the purpose of illustrating the general principles of these teachings, since the scope of these teachings is best defined by the appended claims. Although the teachings have been described with respect to various embodiments, it should be realized these teachings are also capable of a wide variety of further and other embodiments within the spirit and scope of the appended claims.

As used herein, the singular forms "a," "an," and "the" include the plural reference unless the context clearly dictates otherwise.

A "magneto-resistor element," as used herein is an element whose voltage-current characteristic changes due to being in the presence of a magnetic field.

A "serpentine" configuration or structure, as used herein, refers to a structure having an array of elements connected such that in going from one element to another element a winding path is followed. Such a serpentine structure includes the array of elements and the connecting element from one element to a next element.

Except where otherwise indicated, all numbers expressing quantities of ingredients, reaction conditions, and so forth used in the specification and claims are to be understood as being modified in all instances by the term "about."

One embodiment of the sensor of these teachings includes two reference resistor elements and two magnetic field sensing components.

In one or more embodiments, the magnetic field sensing component of these teachings includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and a flux concentrating structure, the flux concentrating structure being disposed in a horizontal plane above the array of line elements and the first connecting elements and said second connecting elements. The flux concentrating structure includes a first end, a second end and a number of bars extending from at least one of the first end or the second end, each one bar being horizontally disposed between and substantially parallel to two line elements and a distance between the first end and the second end being longer than a longest distance between said first connecting elements and said second connecting elements. Each flux concentrator bar may be offset from, coincident with or overlapping the edge of the sensing line element.

In one instance, a width of each bar from the number of bars in said flux concentrating structure is selected to substantially optimize sensitivity and/or linear range of the magnetic field sensing component (sensitivity=$\Delta$output/$\Delta$H, where H is the magnetic field strength.

In another instance, a thickness of each bar from the number of bars in said flux concentrating structure is selected to substantially optimize sensitivity and linear range of the magnetic field sensing component.

In yet another instance, a spacing between each one bar in the flux concentrating structure and each one of the two line elements adjacent to that one bar in the flux concentrating structure is selected to substantially optimize sensitivity and/or linear range of the magnetic field sensing component.

In a further instance, the relative spacing and overlap between the flux concentrator on the sensing element is selected to substantially optimize the sensitivity and linear range of the magnetic field sensing component.

The magnetic field sensing component can be, but is not limited to, a giant magneto resistance (GMR) structure, a spin valve structure, an anisotropic magneto resistance (AMR) sensor, a magneto-impedance sensor (MI), a giant magneto impedance sensor (GMI) or a magnetic tunneling junction (MJT) structure. Exemplary embodiments of each of the above disclosed structures are presented herein below.

In one or more embodiments of a first form, the sensor of these teachings includes two reference resistor elements 32 and two magneto-resistor sensing elements 37. Each magneto-resistor sensing element includes an array of line elements 202, each line element being a magnetic field sensing structure, first connecting elements 206, each first connecting element 206 positioned to connect first ends of two adjacent line elements, second connecting elements 204, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure 52, a second flux concentrating/shielding structure 57, and a flux concentrating structure 54. The first flux concentrating/shielding structure 52 is disposed over one of the two reference resistor elements 32 in order to substantially shield the one reference resistor element from external fields; the second flux concentrating/shielding structure 57 is disposed over another of the two reference resistor elements 32 in order to substantially shield the other reference resistor element from external fields. The two magneto-resistor sensing elements 37 are disposed between the first concentrating/shielding structure 52 and the second flux concentrating/shielding structure 57. The flux concentrating structure 54 is disposed in a horizontal plane above the array of line elements 202 from each of the two magneto-resistor sensing elements 37 and the first connecting elements and the second connecting elements from each of the two magneto-resistor sensing elements. The flux concentrating structure includes a first end, a second end and a number of bars extending from at least one of the first end or the second end. Each bar is horizontally disposed between and substantially parallel to two line elements from one of the two magneto-resistor sensing elements. Each flux concentrator bar may be offset from, coincident with or overlapping the edge of a sensing line element. A distance between the first end and the second end is longer than a longest distance between the first connecting elements and the second connecting elements from a first or second magneto-resistor sensing element.

The two reference resistor elements and the two magneto-resistor elements are connected to form a Wheatstone Bridge configuration, each of arm of the Wheatstone Bridge comprising one reference resistor and one magneto-resistor element. Output of the Wheatstone Bridge is provided by a voltage between points of connection of the reference resistor element and the magneto-resistor element in each arm of the Wheatstone Bridge.

The magneto-resistor element can be, but is not limited to, a giant magneto resistance (GMR) sensor (see, for example, U.S. Pat. No. 6,961,225 or Xiao et al., Phys. Rev. Letters, Vol. 68, No. 25, pp. 3749-3752, 22 Jun. 1992, both of which are Incorporated by reference herein in their entirety for all purposes), a GMR-spin valve sensor (having a pinned layer, see for example, U.S. Pat. Nos. 5,920,446, 5,583,725, D. E. Heim, Design and Operation of Spin Valve Sensors, IEEE Transactions On Magnetics, Vol. 30, No. 2, March 1994, pp. 316-321, all of which are Incorporated by reference herein in their entirety and for all purposes), an anisotropic MR (AMR) sensor such as described in U.S. Pat. No. 5,247,278 or a magnetic tunneling junction (MJT) sensor (see, for example, U.S. Pat. No. 5,650,958, which is Incorporated by reference herein in its entirety and for all purposes). The sensor can also be a magnetoimpedance (MI) sensor, such as, for example, the sensor described in US patent application publication 20120038358 or in U.S. Pat. No. 6,861,838, or a giant magnetoimpedance (GMI) sensor, such as, for example, the sensor described in F. Amalou and M. A. M. Gijs, Giant magnetoimpedance in trilayer structures of patterned magnetic amorphous ribbons, Appl. Phys. Lett. 81, 1654 (2002), all of which are Incorporated by reference herein in their entirety and for all purposes.

In other embodiments of a second form, the sensor of these teachings includes two reference resistor elements and two magneto-resistor sensing elements. Each magneto-resistor sensing element includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure and a second flux concentrating/shielding structure. The first flux concentrating/shielding structure is disposed over one of the two reference resistor elements in order to substantially shield said one reference resistor element from external fields. The first flux concentrating/shielding structure includes a first end and a second end; the one reference resistor element being disposed between the first end and the second end. The second flux concentrating/shielding structure is disposed over another of the two reference resistor elements in order to substantially shield the other reference resistor element from external fields. The second flux concentrating/shielding structure has a third end and a fourth end. The other reference resistor element is disposed between the third end and the fourth end. The two magneto-resistor sensing elements are disposed between the first concentrating/shielding structure and the second flux concentrating/shielding structure so that each one of the two magneto resistor elements is adjacent to the first end of the first flux concentrating/shielding structure and each one of the two magneto resistor elements is adjacent to the third end of the second flux concentrating/shielding structure. Each line element from the array of line elements in each of the two magneto-resistor elements is substantially parallel to the first end of the first flux concentrating/shielding structure and to the third end of the second flux concentrating/shielding structure.

In one embodiment of the system of these teachings, the other embodiment of the sensor is used for the sensors sensing the magnetic field components in a plane and the first embodiment of the sensor disclosed herein above is used for the sensors sensing the magnetic field component perpendicular to the plane, FIG. 1a depicts one specific embodiment of the system of these teachings. This is a tri axis magnetic compassing sensor showing separate y, x and z-axis sensors each in a Wheatstone bridge configuration. Each sensor has two reference magneto-resistor elements 30,32 and two sensing magneto-resistor elements 35, 37 connected by conductors 40 and terminated in bond pads 45, 47 for external wiring connection. The flux shielding concentrators 50,52,55,57 act as magnetic shields to the reference magneto resistors buried beneath them. Some of the flux shielding concentrators 50, 55 are wide at the top (remote from the sensing magneto-resistors) and narrow at the end near the sensing magneto-resistors, providing flux-concentration. The flux concentrator narrow ends are proximate to and interleaved with the sensing magneto-resistors, providing maximum directional coupling from external field to the sensing elements.

Figure 1B:
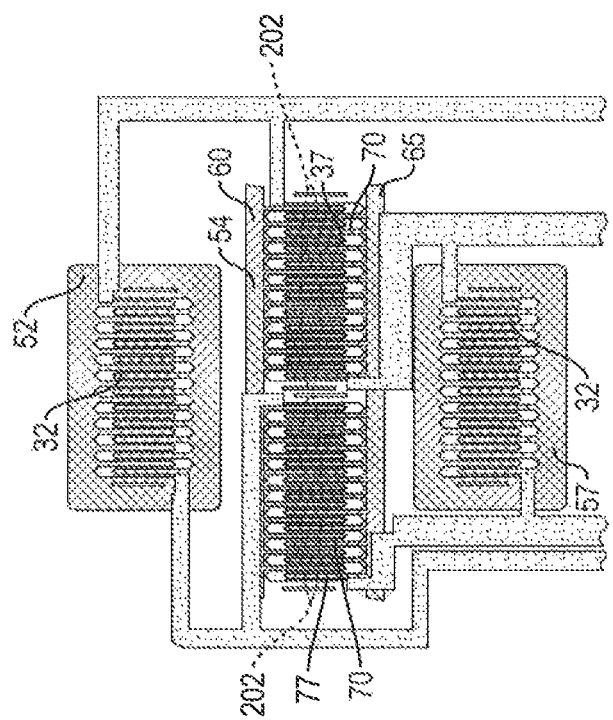
FIG. 1b depicts one embodiment of the sensor of these teachings.
Figure 8:
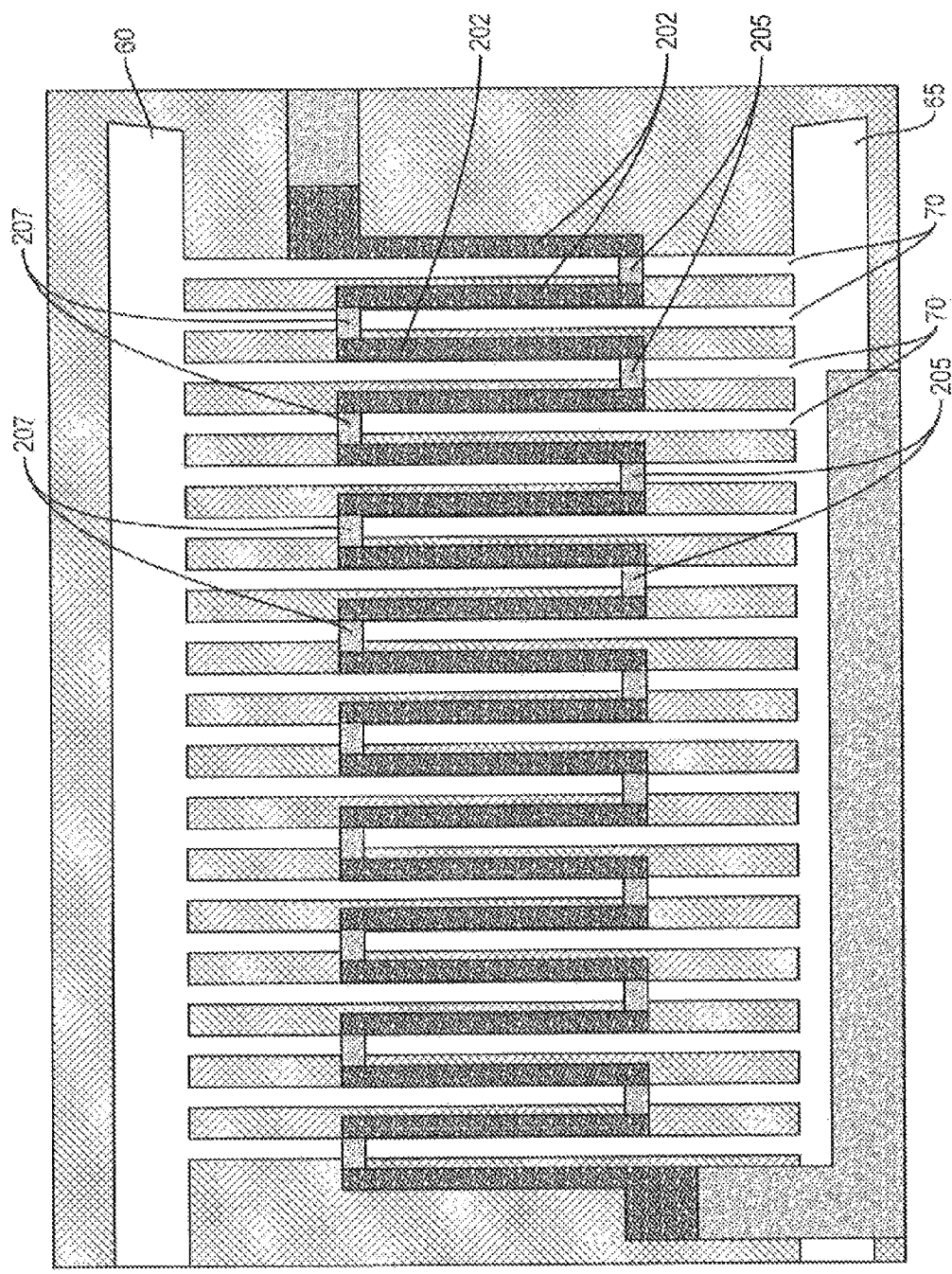
FIG. 8 depicts one embodiment of the positioning of bars of a flux concentrator with respect to MR sensing line elements.
Figure 9:
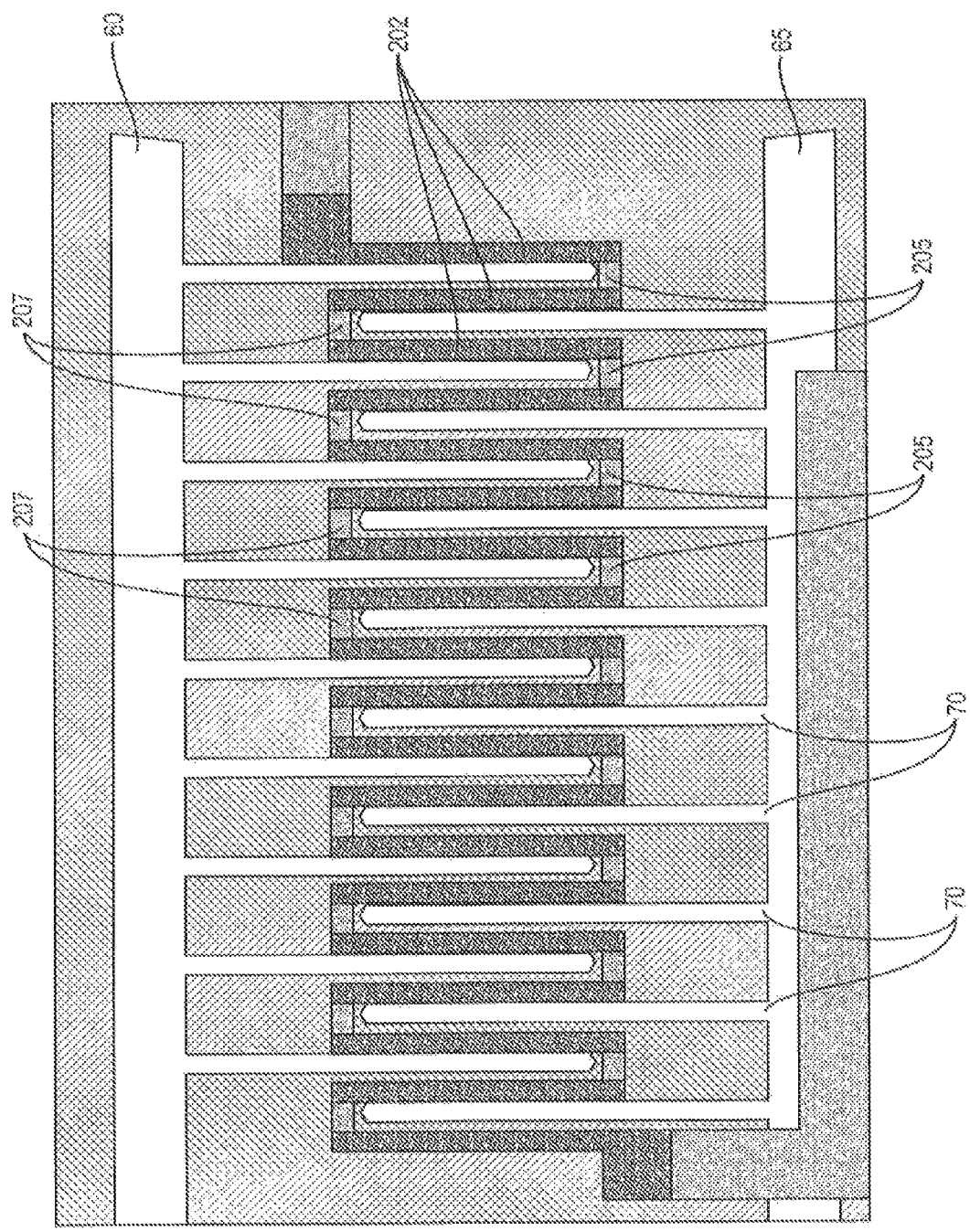
FIG. 9 depicts another embodiment of the positioning of bars of a flux concentrator with respect to MR sensing line elements.

FIG. 1b shows a magnetic field sensor of the first form, which is used for sensing the magnetic field component perpendicular to the plane (also referred to as the Z axis). Referring to FIG. 1b, in the embodiment shown there in, the sensor of these teachings includes two reference resistor elements 32 and two magneto-resistor sensing elements 37. Each magneto resistor sensing element includes an array of line elements 202, each line element being a magnetic field sensing structure, first connecting elements 206, each first connecting element 206 positioned to connect first ends of two adjacent line elements, second connecting elements 204, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure 52, a second flux concentrating/shielding structure 57, and a flux concentrating structure 54. The first flux concentrating/shielding structure 52 is disposed over one of the two reference resistor elements 32 in order to substantially shield the one reference resistor element from external fields; the second flux concentrating/shielding structure 57 is disposed over another of the two reference resistor elements 32 in order to substantially shield the other reference resistor element from external fields. The two magneto-resistor sensing elements 37 are disposed between the first concentrating/shielding structure 52 and the second flux concentrating/shielding structure 57. The flux concentrating structure 54 is disposed in a horizontal plane above the array of line elements 202 from each of the two magneto-resistor sensing elements 37 and the first connecting elements and the second connecting elements from each of the two magneto-resistor sensing elements. The flux concentrating structure includes a first end 60, a second end 65 and a number of bars 70 extending from at least one of the first end 60 or the second end 65 (in the embodiment shown, the bars 70 extend from the first end 60 to the second end 65). Each bar is horizontally disposed between and substantially parallel to two line elements from one of the two magneto-resistor sensing elements. Each flux concentrator bar may be offset from, coincident with or overlapping the edge of the sensing line element. The flux concentrator bar 70 may be offset from, coincident with or overlapping the edge of the sensing element 202. The Z-axis flux concentrator 54 collects external vertically-oriented magnetic field, concentrates it and directs it downwards in the vertical direction towards the MR sensing element 202. There, the converted in-plane component of the initially vertical field couples with the sensing element to create signal. The edge of the bars of the flux concentrator 70, and thus the maximum field gradient, is ideally positioned with an optimized offset or overlap with regard to the MR sensing line element 202. This positioning enables maximizing Z-axis sensor sensitivity and output. FIGS. 8 and 9 show two embodiments of the positioning of the bars of the flux concentrator 70 with respect to the MR sensing line element 202. It should be noted that although FIGS. 8 and 9 show embodiments in which the bars 70 extend from the first end 60 to the second end 65, embodiments in which a first number of bars extend from and are connected to the first end and a second number of bars extend from and are connected to the second end; the first number of bars and the second number of bars forming an interdigitated structure (such as shown in FIG. 1g) are also within the scope of these teachings. (FIG. 9 is labeled in the same manner as FIG. 8.)

A distance between the first end and the second end is longer than a longest distance between the first connecting elements and the second connecting elements from a first or second magneto-resistor sensing element.

Figure 1C:
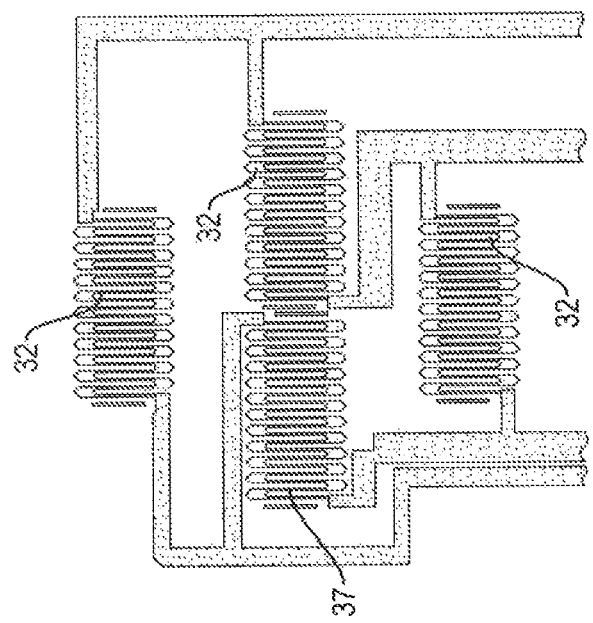
FIGS. 1c and 1d depict separate components of the embodiment of the sensor of these teachings shown in FIG. 1b.

FIG. 1c shows the interconnection between the reference resistor 32 and the magneto resistor sensing elements 37 for the magnetic sensor of FIG. 1b. It should be noted that in all of the embodiments of these teachings, in one instance, the reference resistors can also be magneto resistors.

Figure 1D:
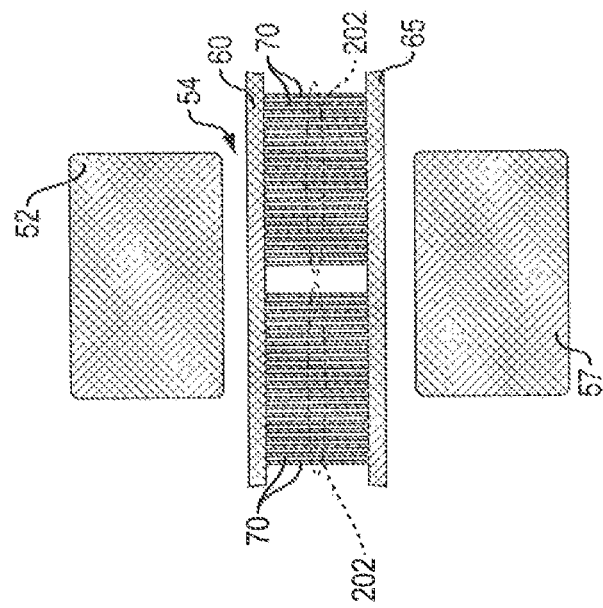

FIG. 1d shows one embodiment of the flux concentrating/shielding structures and the flux concentrating structure 54 for the magnetic sensor of FIG. 1b. Referring to FIG. 1d, in the embodiment shown there in, the flux concentrating structure 54 is disposed between the first concentrating/shielding structure 52 and the second concentrating/shielding structure 57. The flux concentrating structure 54 includes a first end 60, a second end 65 and a number of bars 70 extending from the first end 60 to the second end 65, FIG. 1g shows another embodiment of the flux concentrating/shielding structures and the flux concentrating structure 54 for the magnetic sensor of FIG. 1b. Referring to FIG. 1g, in the embodiment shown there in, the flux concentrating structure 54 is disposed between the first concentrating/shielding structure 52 and the second concentrating/shielding structure 57. In the embodiment shown in FIG. 1g, the flux concentrating structure includes a first end 60, a second end 65. A first number of bars 72 extend from the first end 60 towards the second end 65 and are connected to the first end 60. A second number of bars 74 extend from the second end 65 towards the first end 60 and are connected to the second end 65. The first number of bars 72 and the second number of bars 74 form an interdigitated flux concentrating structure. (A different embodiment is shown in FIG. 1d.)

Figure 1E:
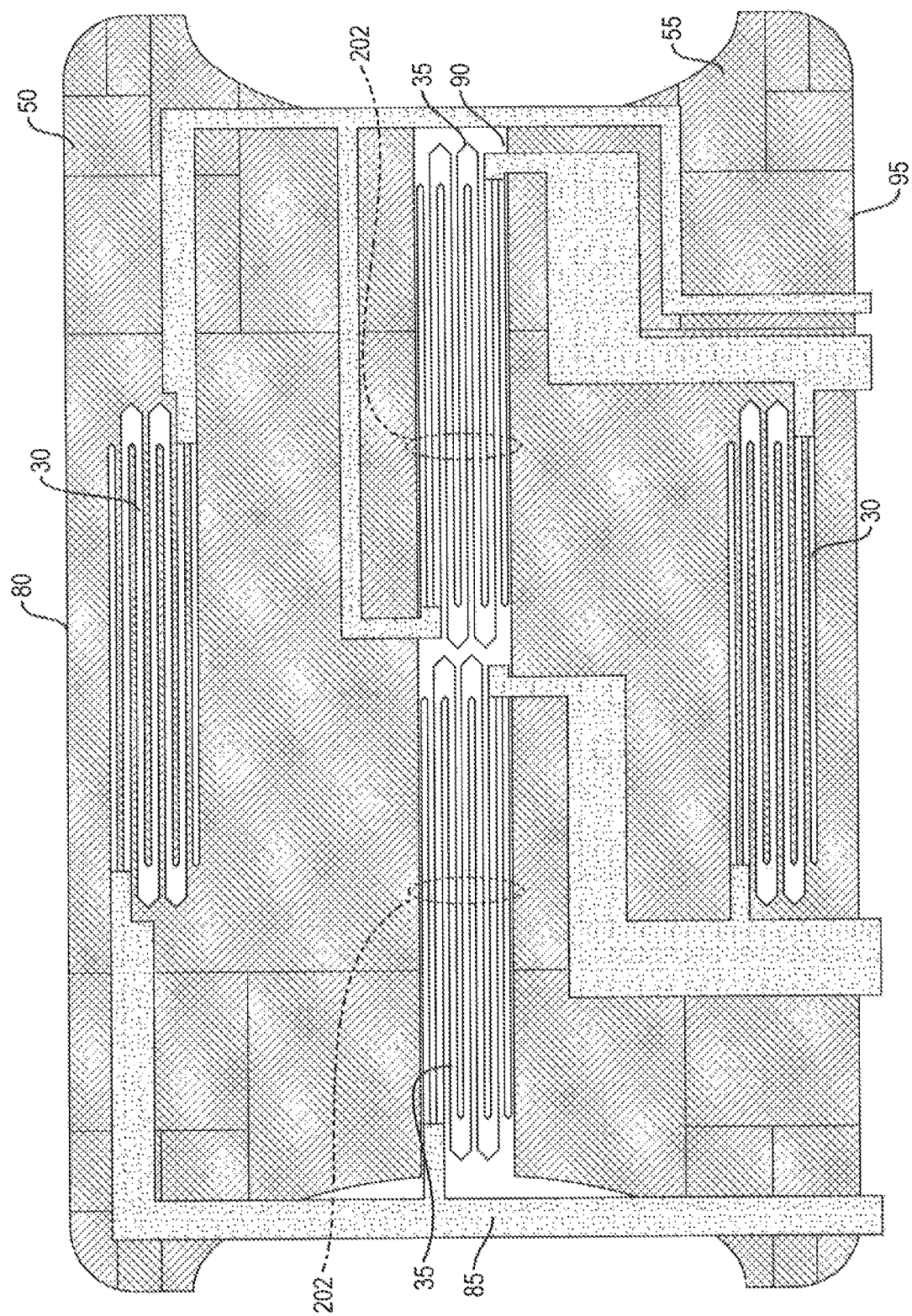
Figure 1G:
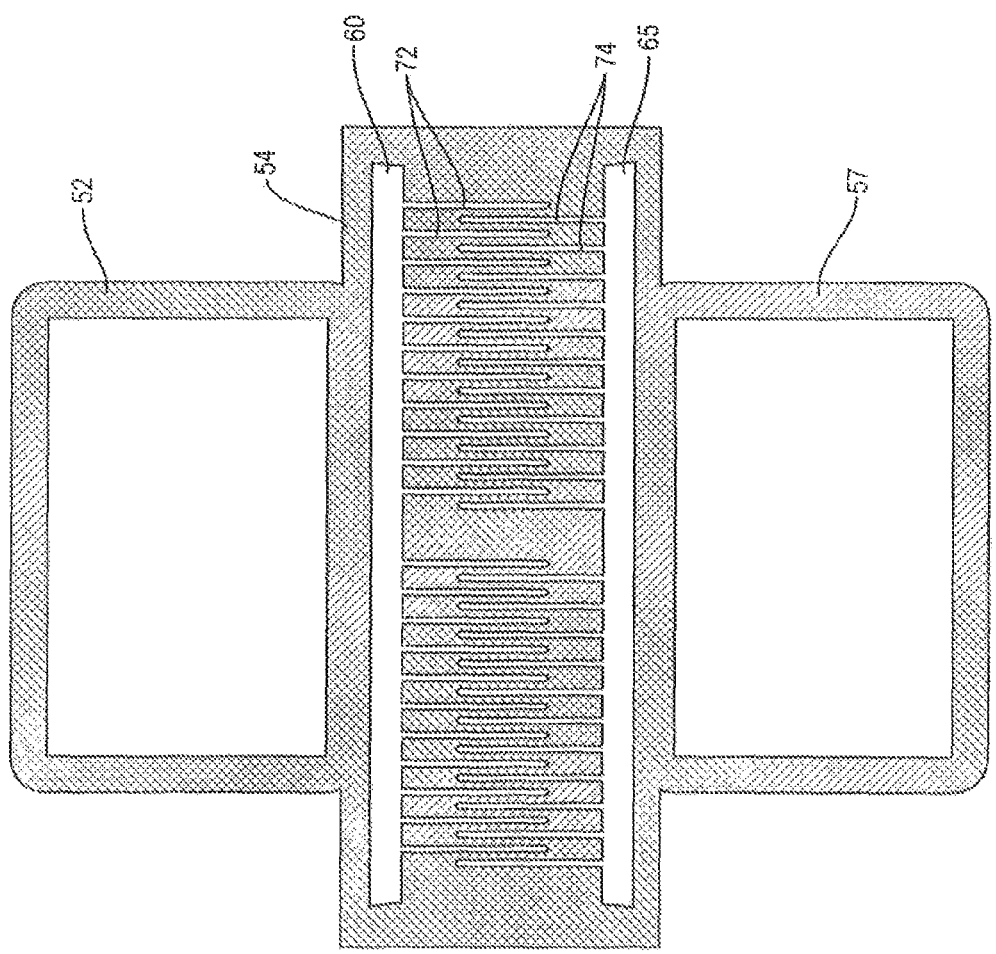
FIG. 1g shows another embodiment of one component of an embodiment of the sensor of these teachings.
Figure 1H:
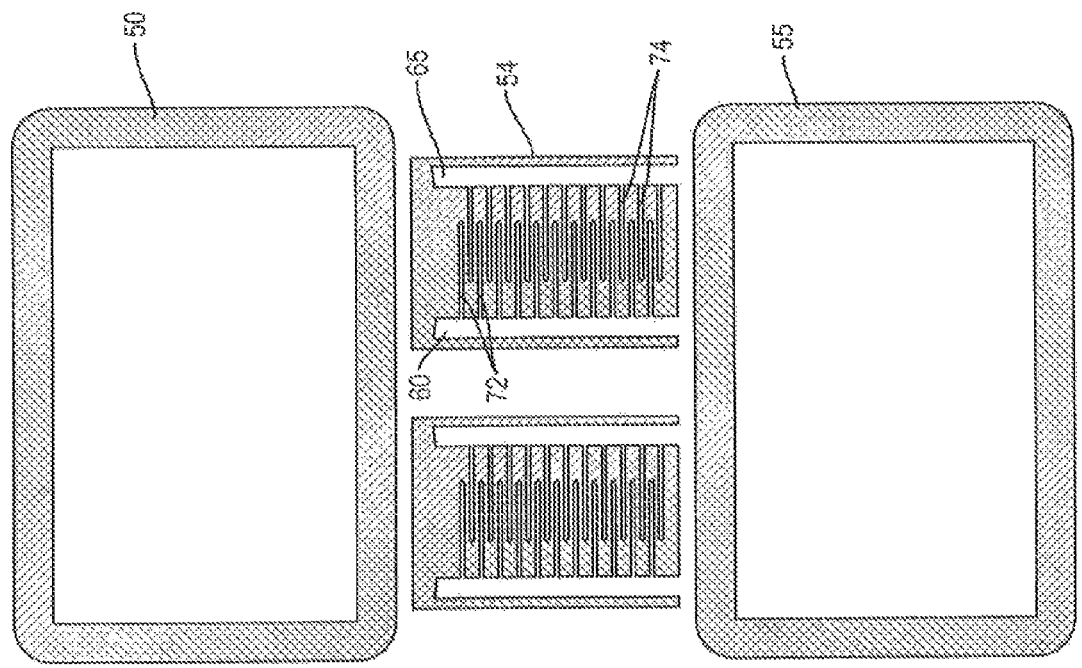
FIG. 1h shows yet another embodiment of one component of an embodiment of the sensor of these teachings.

FIG. 1h shows yet shows another embodiment of the flux concentrating/shielding structures and the flux concentrating structure 54 for the magnetic sensor of FIGS. 1e or 1f. Referring to FIG. 1g, in the embodiment shown there in, the flux concentrating structure 53 is disposed between the first concentrating/shielding structure 50 and the second concentrating/shielding structure 55. In the embodiment shown in FIG. 1h, the flux concentrating structure includes a first end 60, a second end 65. A first number of bars 72 extend from the first end 60 towards the second end 65 and are connected to the first end 60. A second number of bars 74 extend from the second end 65 towards the first end 60 and are connected to the second end 65. The first number of bars 72 and the second number of bars 74 form an interdigitated flux concentrating structure. In a different embodiment, similar to the embodiment shown in FIG. 1d, the first and second number of bars 72, 74 extend from the first end 60 to the second end 65 and are connected to the both the first end 60 and the second end 65. (It should be noted that the dimensions of the flux concentrating structure 53, the first concentrating/shielding structure 50 and the second concentrating/shielding structure 55, as shown, are not to scale or represent a definite dimension.)

In one embodiment, the magnetic sensor of FIGS. 1e or 1f also includes a flux concentrating structure. The flux concentrating structure, such as the structure shown in FIG. 1h (or the embodiment, similar to the embodiment shown in FIG. 1d, in which the first and second number of bars 72, 74 extend from the first end 60 to the second end 65 and are connected to the both the first end 60 and the second end 65 being disposed in a horizontal plane above said array of line elements and said first connecting elements and said second connecting elements) is disposed in a horizontal plane above the array of line elements and the first connecting elements and the second connecting elements.

FIG. 1e shows an embodiment of the magnetic field sensor of the second form, which is used for sensing one of the orthogonal magnetic field components in a plane—the Y component. Referring to FIG. 1e, in the embodiment shown therein, the sensor of these teachings includes two reference resistor elements 30 and two magneto-resistor sensing elements 35. Each magneto resistor sensing element 35 includes an array of line elements 202, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element. The embodiment of the sensor of these teachings also includes a flux concentrating/shielding subsystem. The flux concentrating/shielding subsystem has a first flux concentrating/shielding structure 50 and a second flux concentrating/shielding structure 55. The first flux concentrating/shielding structure is disposed over one of the two reference resistor elements 30 in order to substantially shield said one reference resistor element from external fields. The first flux concentrating/shielding structure includes a first end 85 and a second end 80; the one reference resistor element being disposed between the first end and the second end. The second flux concentrating/shielding structure is disposed over another of the two reference resistor elements in order to substantially shield the other reference resistor element from external fields. The second flux concentrating/shielding structure has a third end 90 and a fourth end 95. The other reference resistor element 30 is disposed between the third end 90 and the fourth end 95. The two magneto-resistor sensing elements are disposed between the first concentrating/shielding structure 50 and the second flux concentrating/shielding structure 55 so that each one of the two magneto resistor elements is adjacent to the first end 85 of the first flux concentrating/shielding structure 50 and each one of the two magneto resistor elements is adjacent to the third end 90 of the second flux concentrating/shielding structure 55. Each line element from the array of line elements in each of the two magneto-resistor elements is substantially parallel to the first end 85 of the first flux concentrating/shielding structure 50 and to the third end 90 of the second flux concentrating/shielding structure 55, FIG. 1f shows another embodiment of the magnetic field sensor of the second form, which is used for sensing another of the orthogonal magnetic field components in a plane—the X component. The elements in FIG. 1f are similar to the elements in FIG. 1e except that the sensor in FIG. 1f is oriented such as to sense the X component.

Figure 2A:
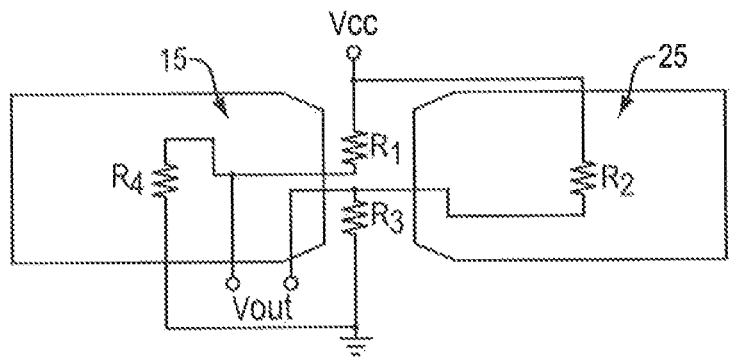
FIGS. 2a-2c show a schematic circuit diagram representation of a Wheatstone Bridge configuration of embodiments of the system of these teachings.
Figure 2B:
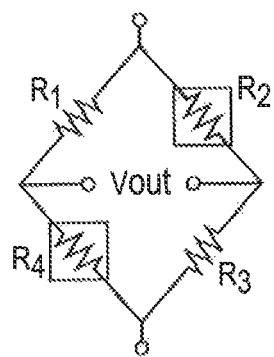
Figure 2C:
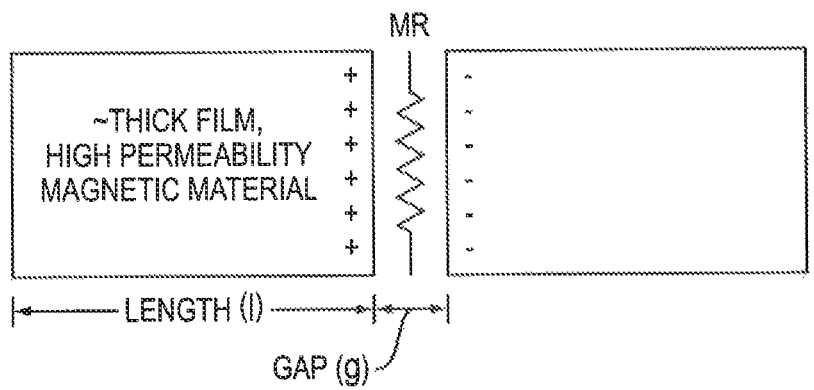

The magneto-resistor sensing elements can be, but are not limited to, a giant magneto resistance (GMR) structure, a spin valve structure, an anisotropic magneto resistance (AMR) structure, a magneto-impedance sensor (MI), a giant magneto impedance sensor (GMI) or a magnetic tunneling junction (MJT) structure. Exemplary embodiments of each of the above disclosed structures are presented herein above. In one instance, the reference resistor elements are also magneto-resistor elements, FIGS. 2a-2c show a circuit diagram for the Wheatstone bridge sensor where $R_1$ and $R_3$ are sensing magneto-resistors and $R_2$ and $R_4$ are shielded reference magneto-resistors. A generalized combination flux-concentrator/flux-shield is shown overlaying or proximate to the reference and sensing magneto-resistive elements, respectively. Referring to FIG. 2a, magneto-resistors $R_1$ and $R_4$ are connected in series with magneto-resistor $R_4$ being shielded by a shielding/flux concentrating component 15 and magneto-resistors $R_2$ and $R_3$ are connected in series with magneto-resistor $R_2$ being shielded by a shielding/flux concentrating component 25. The series connection of magneto-resistors $R_1$ and $R_4$ is connected in parallel with this series connection of magneto-resistors $R_2$ and $R_3$. FIG. 2b shows the circuit schematic for the Wheatstone Bridge configuration. Output of the Wheatstone Bridge is provided by a voltage between points of connection of the reference shielded magneto-resistor and the sensing (unshielded) magneto-resistor in each arm of the Wheatstone Bridge. FIG. 2c shows the flux concentration effect due to the concentrating/shielding structures. In one instance, the concentration ratio can be approximated by the ratio of the length of the concentrating/shielding structure to the gap between the two concentrating/shielding structures. In another instance, the expression for the concentration ratio includes the effects of concentrating/shielding structure thickness.

Figure 3:
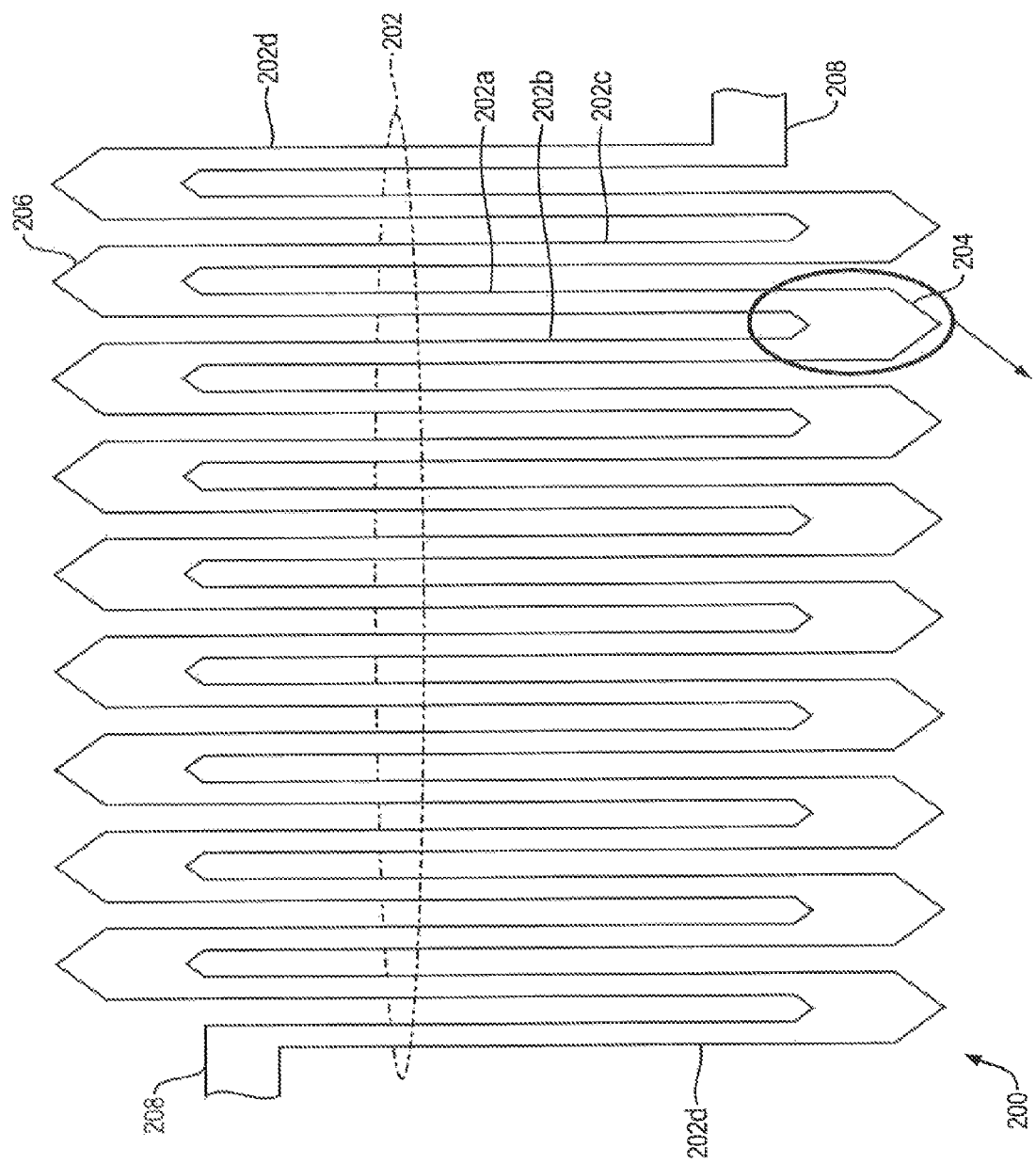
FIG. 3 depicts a serpentine-shaped magneto-resistive element as used in these teachings.

FIG. 3 depicts one embodiment of a serpentine-shaped magneto-resistive element. This may be, but is not limited to, a GMR multilayer or spin-valve resistive element (U.S. Pat. No. 7,639,005, which is Incorporated by reference herein in its entirety and for all purposes, shows a GMR multilayer serpentine). This serpentine may be oriented in x or y orientations. Resistance values may be selected to provide low power-consumption and high magneto-resistance, DR/R (change in resistance vs. applied magnetic field).

Referring to FIG. 3, the serpentine shape is formed by an array of, long, narrow and thin sensing elements 202. For ease of reference, elements 202 are described herein as lines or wires 202, without limitation as to their cross-sectional shape. Each line or wire 202 is connected at its upper and lower ends to opposite ones of its adjacent lines or wires. For example, wire 202 a has a lower connection 204 connecting to wire 202 b, and an upper connection 206 connecting to wire 202 c. In the case of the outermost wires 202 d, the ends 208 of resistor 200 connect to the circuitry (not shown) of which resistor 200 forms a part. As is conventionally known, the number, length, width and spacing of wires 202 may be varied to suit the desired resistances, circuit sizing and/or fabrication techniques for the circuit or sensor.

Figure 3A:
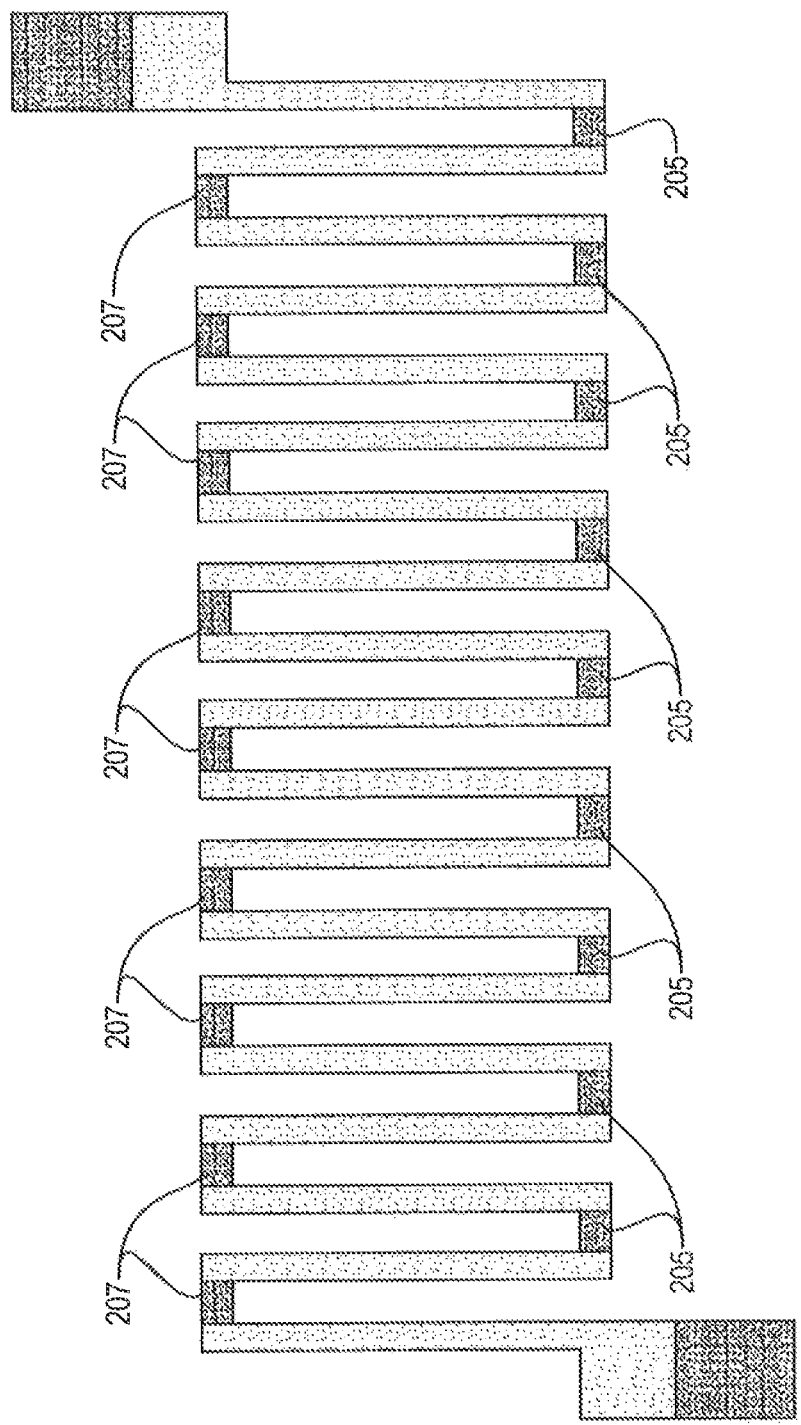
FIG. 3a depicts another serpentine-shaped magneto-resistive element as used in these teachings.

Referring to FIG. 3a, in another embodiment, the serpentine shape is formed by an array of, long, narrow and thin sensing elements 202. For ease of reference, elements 202 are described herein as lines or wires 202, without limitation as to their cross-sectional shape. Each line or wire 202 is connected at its upper and lower ends to opposite ones of its adjacent lines or wires. For example, wire 202 a has a lower connection 205 connecting to wire 202 b, and an upper connection 207 connecting to wire 202 c. In the embodiment shown in FIG. 3a, the lower connection 205 and the upper connection 207 are composed of a nonmagnetic material. In the case of the outermost wires 202 d, the ends 208 of resistor 200 connect to the circuitry (not shown) of which resistor 200 forms a part. As is conventionally known, the number, length, width and spacing of wires 202 may be varied to suit the desired resistances, circuit sizing and/or fabrication techniques for the circuit or sensor.

Figure 4:
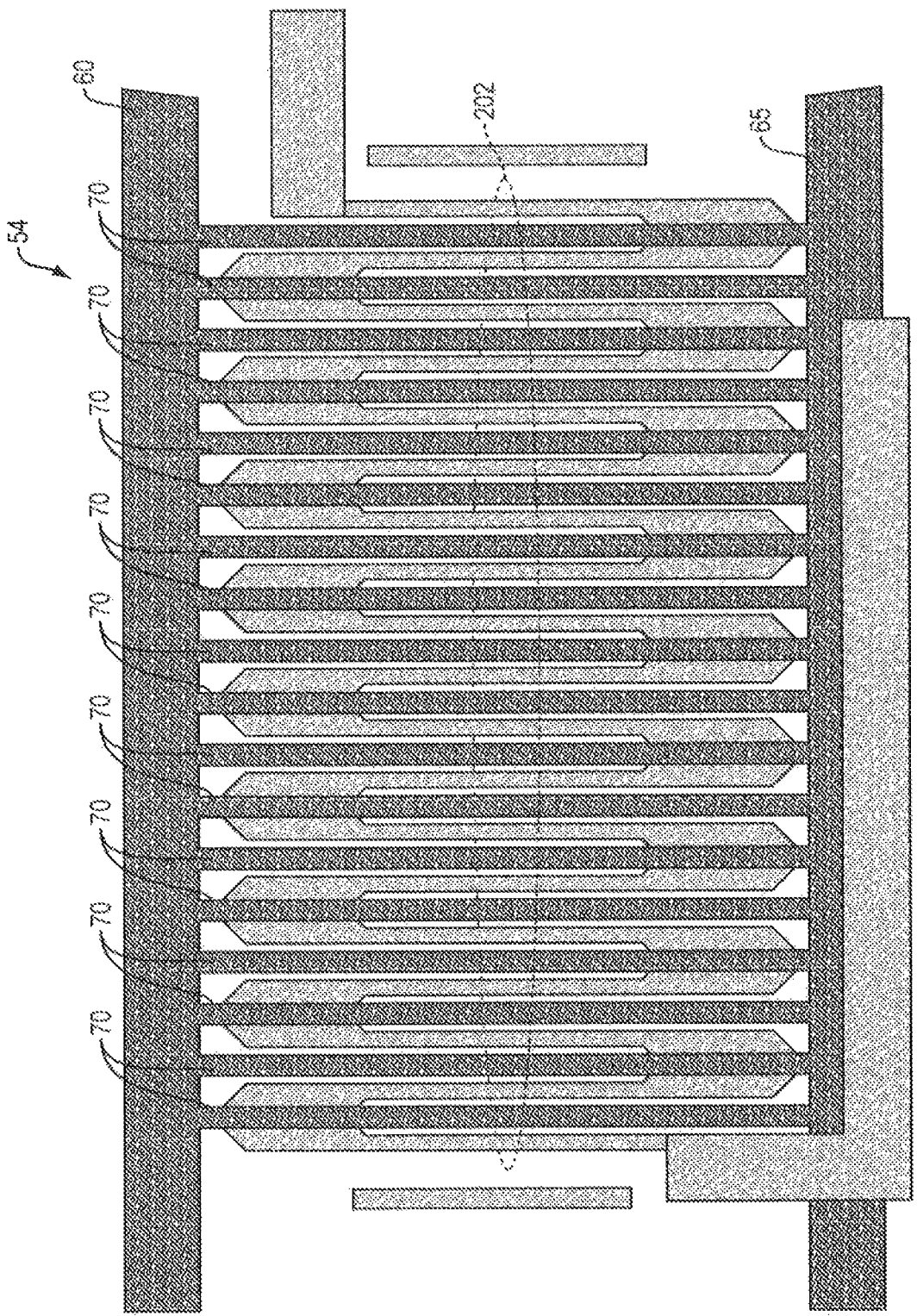
FIG. 4 depicts a close-up view of the embodiment of FIG. 1b.

FIG. 4 depicts a close-up view of the flux concentrating structure 54, for the embodiment shown in FIG. 1b, with flux concentrating structure 54 disposed in a horizontal plane of the array of magneto-resistive sensing line elements 202 and having a first end 60, a second and 65 and a number of bars 70, the bars 70 horizontally disposed between and substantially parallel to two line elements 202 (for the sake of clarity not all bars 70 are labeled). Each flux concentrator bar may be offset from, coincident with or overlapping the edge of the sensing line element.

Figure 5:
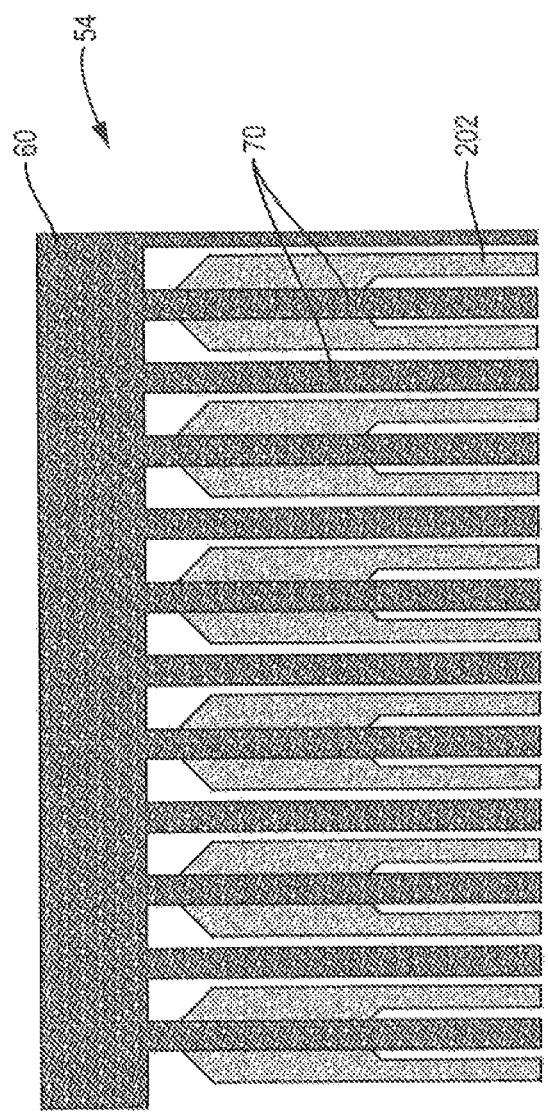
FIG. 5 depicts a close-up view of the combined flux-concentrator with directional flux concentrator elements interleaved with and proximate to the serpentine-shaped magneto-resistive sensing elements of these teachings.

FIG. 5 depicts another close-up view of the of the flux concentrating structure 54, the first and 60 and some of the bars 70, the bars 70 being interleaved with and proximate to the serpentine-shaped magneto-resistive sensing elements 202 of these teachings.

With regard to the flux-concentrator design, important design factors are flux concentrator area and thickness, material, flux-concentrator bar width, finger thickness and the offset distance (both in plane and out of plane) from the sensor.

The flux-concentrator functions by passively coupling to external magnetic fields, collecting the magnetization and transmitting it from one region of the device to another. Flux is transmitted from the concentrator through the sensing element. Driving force for the flux conduction is the external field. Magnetic reluctances include the flux-concentrator coercivity and anisotropy fields, shape-demagnetization and flux-concentrator to sensing element gaps.

The flux-concentrator/sensor design provides enhanced magnetic field directionality, important for specified axis sensing. The flux-concentrator/sensor design provides enhanced external field magnetization direction/steering to the sensing elements.

Figure 7:
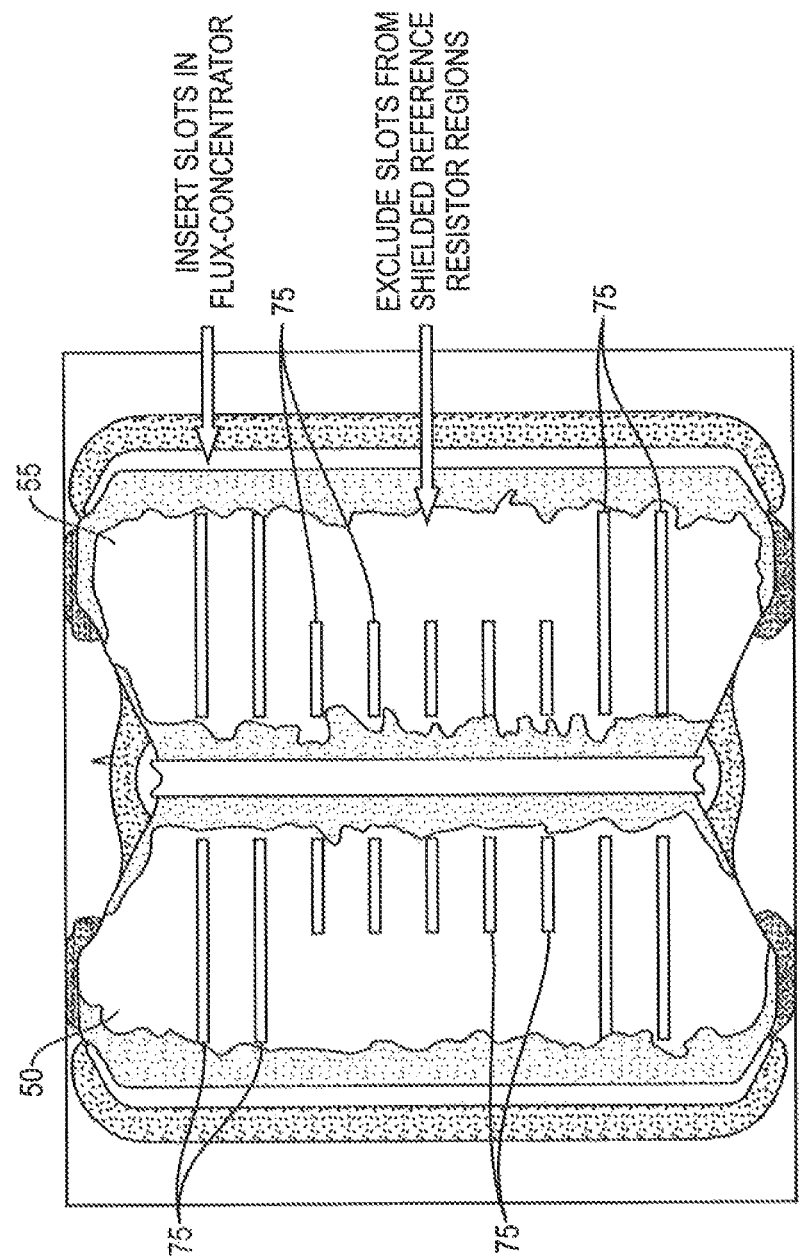
FIG. 7 depicts an embodiment of a flux concentrator/shielding structure used in embodiments of the system of these teachings.

In one embodiment, shown in FIG. 7, the flux concentrating/shielding structure 50, 55 has a plurality of openings (slots) 75. The openings (slots) 75 do not have soft magnetic material. No opening (slot) 75 is located in an area of the flux concentrating/shielding structure 50, 55 under which one of the two reference magneto-resistor elements is disposed.

One embodiment of the method for fabricating a magnetic field sensing component includes depositing a number of magnetic field sensing structures as line elements in an array of magnetic field sensing structures, patterning and depositing conductor elements to connect first and second ends of adjacent line elements; the connecting elements connecting the first and second ends of the adjacent line elements in order to form a substantially serpentine structure, depositing a dielectric layer to provide isolation between the magnetic field sensing structures, patterning and etching deposition vias in the dielectric layer and patterning and depositing a flux concentrator structure, the flux concentrator structure having a first end, a second end and a number of bars extending from at least one of the first end or the second end, each one bar being horizontally disposed between and substantially parallel to two line elements from one of the two magneto-resistor sensing elements. Each flux concentrator bar may be offset from, coincident with or overlapping the edge of the sensing line element. A distance between the first end and the second end is longer than a longest distance between the first connecting elements and the second connecting elements from a first or second magneto-resistor sensing element.

In one instance, the method for fabricating a magnetic field sensing component also includes depositing an encapsulation layer, patterning and etching vias in the encapsulation layer and depositing bond pads to enable external connection to the magnetic field sensing structures.

In one embodiment, magnetic field sensor fabrication sequence consists of the following generalized steps. Deposition of the sensing element materials on a planar wafer substrate surface. The substrate may be thermally oxidized silicon or a ceramic material. The substrate could also provide for including active circuitry, such as, but not limited to, CMOS, or a MEMS device or provide for including a MEMS device. Good surface smoothness is required. The ferromagnetic sensing element stack (AMR, GMR, etc.) is deposited on the wafer surface, micro-lithographically patterned and etched to form resistive elements with targeted resistances and magneto-resistive response (DR/R). Electrical connections between resistive elements is achieved by microlithographically patterning and depositing conductor elements and terminations (bond pads) by lift-off processing. A dielectric gap layer is then deposited to provide electrical isolation between the sensing elements, their wiring and subsequent layers. Following the dielectric layer deposition vias are microlithographically patterned and etched. Ferromagnetic flux-concentrator/flux-shield are deposited and patterned. This may be done preferably by microlithographic patterning and through-mask electrodeposition or by sheet deposition, microlithographic patterning and etching, depending upon the flux-concentrator material used. Optionally, a encapsulation layer is deposited, vias patterned and etched and bond pads deposited to allow external connection to the sensor device. In this fashion, x, y and z axis sensors can be batch-fabricated.

Figure 6:
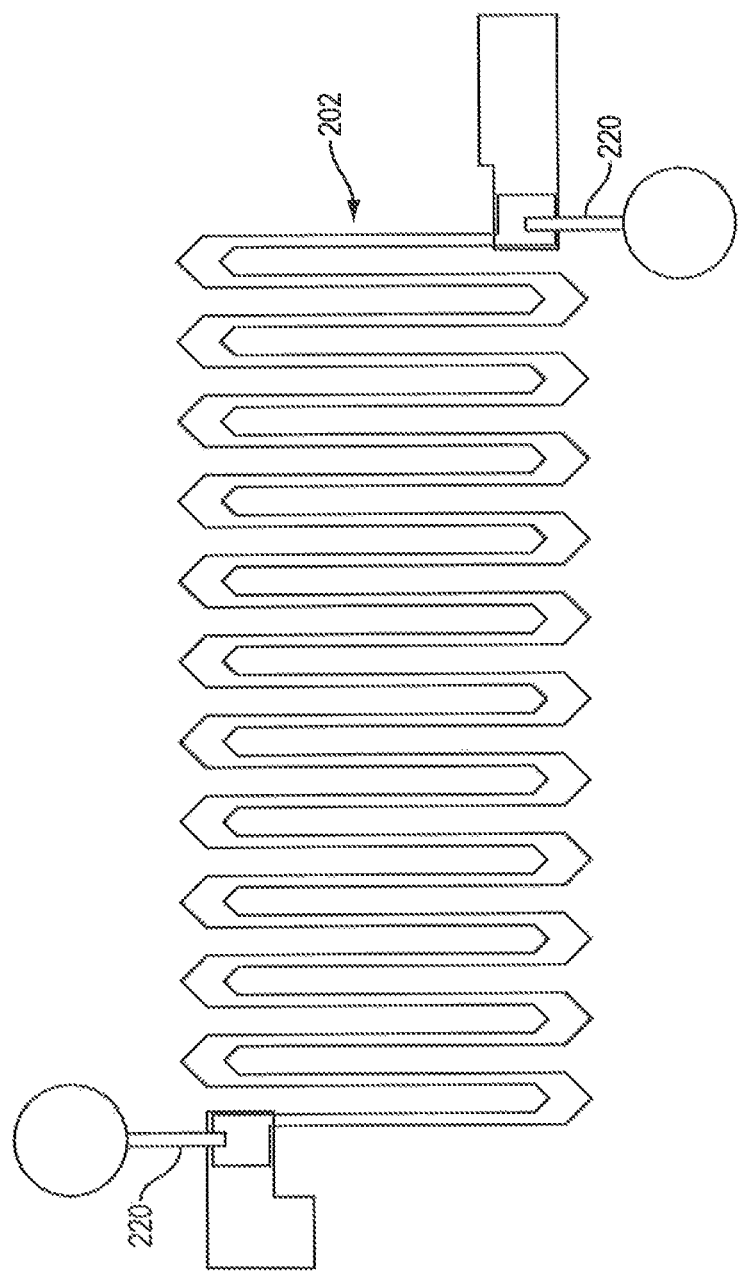
FIG. 6 depicts a serpentine-shaped magneto-resistive element with vias to the substrate with electrostatic discharge protection shunt resistors as used in these teachings.

In one instance, in order to provide electrostatic discharge protection, a shunt resistor to the substrate and a via connection are provided during fabrication. In that instance, the fabrication sequence includes patterning and etching static discharge protection vias and patterning and etching at least one shunt resistor operatively connected to the discharge protection vias. FIG. 6 shows serpentine-shaped magneto-resistive sensing elements 202 with vias to the substrate with shunt resistors 220.

Ferromagnetic sensing element stacks may consist of NiFe AMR material with Ta, NiFeCr or other underlayer/epitaxial and cap layers, MI or GMI components or GMR top or bottom synthetic spin-valves or multi layers or MTJ stacks.

Conductors may consist of an adhesion layer plus Cu, Au, Al or any other low-resistivity conductor material.

Gap layer dielectrics may be Al2O3, Si3N4, and combinations thereof or other electrically insulating materials with suitable dielectric constant and breakdown-voltage to withstand device operating conditions.

Flux-concentrators/flux shields may consist of high-permeability, low-coercivity, low remanence, low magneto striction, low-anisotropy field ferromagnetic materials such as NiFe, NiFeMo, NiFeCo, NiFeB, NiFeP, CoFe, CoFeB, CoFeSiB, CoSiB, CoZrTa or the like.

Encapsulation layers may consist of dielectrics, as used on the previous gap layer. Additional encapsulation layer materials may include cured polymers, such as but not limited to, polyimide (PI), or bis-cyclobutene (BCB) or cured photoresist phenolic polymer.

Bond pad materials may include Au, Cu or Al. Alternatively, the bond pad may be Cu and eutectic solder pillar bumped for flip chip assembly.

With regard to the flux-concentrator design, important design factors are flux concentrator area and thickness, neck-down, material, interweaved flux-concentrator finger width, finger thickness, offset distance from the sensor and sidewall profile.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the invention has been described with respect to various embodiments, it should be realized these teachings are also capable of a wide variety of further and other embodiments within the spirit and scope of the appended claims.

What is claimed is:

1. A magnetic field sensing component comprising:
   an array of line elements; each line element being a magnetic field sensing structure;
   first connecting elements, each first connecting element positioned to connect first ends of two adjacent line elements;
   second connecting elements, each second connecting element positioned to connect opposite ends of the two adjacent line elements to a respective oppositely adjacent line element; and
   a flux concentrating structure; said flux concentrating structure being disposed in a horizontal plane above said array of line elements and said first connecting elements and said second connecting elements;
   said flux concentrating structure comprising:
      a first end;
      a second end; and
      a number of bars extending from at least one of the first end and the second end;
      each one bar from said number of bars being horizontally disposed between and substantially parallel to two line elements;
      a distance between said first end and said second end being longer than a longest distance between said first connecting elements and said second connecting elements.

2. The magnetic field sensing component of claim 1 wherein the magnetic field sensing structure is a giant magneto resistance (GMR) structure.

3. The magnetic field sensing component of claim 1 wherein the magnetic field sensing structure is a spin valve structure.

4. The magnetic field sensing component of claim 1 wherein the magnetic field sensing structure is a magnetic tunneling junction (MJT) structure.

5. The magnetic field sensing component of claim 1 wherein the magnetic field sensing structure is an anisotropic magneto resistance (AMR) structure.

6. The magnetic field sensing component of claim 1 wherein the magnetic field sensing structure is magneto-impedance structure.

7. The magnetic field sensing component of claim 1 wherein the magnetic field sensing structure is a giant magneto-impedance structure.

8. The magnetic field sensing component of claim 1 wherein the number of bars extend from the first end to the second end.

9. The magnetic field sensing component of claim 1 wherein a first number of bars extend from and are connected to the first end and a second number of bars extend from and are connected to the second end; the first number of bars and the second number of bars forming an interdigitated structure.

10. The magnetic field sensing component of claim 1 wherein a width of each bar from the number of bars in said flux concentrating structure is selected to substantially optimize sensitivity and linear range of the magnetic field sensing component.

11. The magnetic field sensing component of claim 1 wherein a thickness of each bar from the number of bars in said flux concentrating structure is selected to substantially optimize sensitivity and linear range of the magnetic field sensing component.

12. The magnetic field sensing component of claim 1 wherein a spacing between each one bar from the number of bars in said flux concentrating structure and each one of the two line elements adjacent to said one bar from the number of bars in said flux concentrating structure is selected to substantially optimize sensitivity and linear range of the magnetic field sensing component.

13. The magnetic, field sensing component of claim 1 wherein the first connecting elements and the second connecting elements are non-magnetic conductor elements.

14. A method for fabricating a magnetic field sensing component, the method comprising:
   depositing a number of magnetic field sensing structures as line elements in an array of magnetic field sensing structures;

patterning and depositing conductor elements to connect first and second ends of adjacent line elements; said conductor elements constituting connecting elements;

the connecting elements connecting the first and second ends of the adjacent line elements in order to form a substantially serpentine structure;

depositing a dielectric layer to provide isolation between the magnetic field sensing structures;

patterning and etching deposition vias in the dielectric layer; and patterning and depositing a flux concentrator structure, said flux concentrating structure comprising:
a first end;
a second end; and
a number of bars extending from at least one of the first end and the second end;
each one bar from said number of bars being horizontally disposed between and substantially parallel to two line elements;
a distance between said first end and said second end being longer than a longest distance between said first connecting elements and said second connecting elements;
said dielectric layer also isolating said flux concentrating structure and the magnetic field sensing structures and connecting elements.

15. The method of claim 14 further comprising:
depositing an encapsulation layer;
patterning and etching vias in the encapsulation layer; and
depositing bond pads to enable external connection to the magnetic field sensing structures.

16. The method of claim 14 further comprising:
patterning and etching static discharge protection vias; and
patterning and etching at least one shunt resistor operatively connected to the static discharge protection vias.

17. The method of claim 14 wherein the number of bars extend from the first end to the second end.

18. The method of claim 14 wherein a first number of bars extend from and are connected to the first end and a second number of bars extend from and are connected to the second end; the first number of bars and the second number of bars forming an interdigitated structure.

19. The method of claim 14 wherein the conductor elements are non-magnetic conductor elements.

20. A sensor comprising:
two reference resistor elements;
two magneto-resistor sensing elements; each magneto-resistor sensing element comprising:
an array of line elements; each line element being a magnetic field sensing structure;
first connecting elements, each first connecting element positioned to connect first ends of two adjacent line elements;
second connecting elements, each second connecting element positioned to connect opposite ends of the two adjacent line elements to a respective oppositely adjacent line element;
and a flux concentrating/shielding subsystem; said flux concentrating/shielding subsystem comprising a first flux concentrating/shielding structure, a second flux concentrating/shielding structure, and a flux concentrating structure; said first flux concentrating/shielding structure disposed over one of the two reference resistor elements in order to substantially shield said one reference resistor element from external fields; said second flux concentrating/shielding structure disposed over another of the two reference resistor elements in order to substantially shield said another reference resistor element from external fields; the two magneto-resistor sensing elements being disposed between said first concentrating/shielding structure and said second flux concentrating/shielding structure; said flux concentrating structure being disposed in a horizontal plane above the array of line elements from each of the two magneto-resistor sensing elements and the first connecting elements and the second connecting elements from each of the two magneto-resistor sensing elements;
said flux concentrating structure comprising:
a first end;
a second end; and
a number of bars extending from at least one of the first end and the second end;
each one bar from said number of bars being horizontally disposed between and substantially parallel to two line elements from one of the two magneto-resistor sensing elements;
a distance between said first end and said second end being longer than a longest distance between the first connecting elements and the second connecting elements from a first or second magneto-resistor sensing element from the two magneto-resistor sensing elements.

21. The sensor of claim 20 wherein the two reference resistor elements and the two magneto-resistor elements connected to form a Wheatstone Bridge configuration, each of arm of the Wheatstone Bridge comprising one reference resistor and one magneto-resistor element; an output of the Wheatstone Bridge being provided by a voltage between points of connection of the reference resistor element and the magneto-resistor element in each arm of the Wheatstone Bridge.

22. The sensor of claim 20 wherein the two reference resistor elements are two other magneto resistor elements.

23. The sensor of claim 20 wherein the first flux concentrating/shielding structure comprises a plurality of openings; a location of any opening from the plurality of openings not being a location in an area of the flux concentrating/shielding structure under which said one of the two reference resistor elements is disposed.

24. The sensor of claim 20 wherein the second flux concentrating/shielding structure comprises a plurality of openings; a location of any opening from the plurality of openings not being a location in an area of the flux concentrating/shielding structure under which said another of the two reference resistor elements is disposed.

25. The sensor of claim 20 wherein the number of bars extend from the first end to the second end.

26. The sensor of claim 20 wherein a first number of bars extend from and are connected to the first end and a second number of bars extend from and are connected to the second end; the first number of bars and the second number of bars forming an interdigitated structure.

27. A sensor comprising:
two reference resistor elements;
two magneto-resistor elements; each magneto-resistor element comprising:
an array of line elements; each line element being a magnetic field sensing structure;
first connecting elements, each first connecting element positioned to connect first ends of two adjacent line elements;

second connecting elements, each second connecting element positioned to connect opposite ends of the two adjacent line elements to a respective oppositely adjacent line element;

and a flux concentrating/shielding subsystem; said flux concentrating/shielding subsystem comprising a first flux concentrating/shielding structure, and a second flux concentrating/shielding structure; said first flux concentrating/shielding structure disposed over one of the two reference resistor elements in order to substantially shield said one reference resistor element from external fields; said first flux concentrating/shielding structure comprising a first end and a second end; said one reference resistor element being disposed between said first end and said second end; each one of the two magneto resistor elements being adjacent to said first end; said second flux concentrating/shielding structure disposed over another of the two reference resistor elements in order to substantially shield said another reference resistor element from external fields; said second flux concentrating/shielding structure comprising a third end and a fourth end; said another reference resistor element being disposed between said third end and said fourth end; each one of the two magneto resistor elements being adjacent to said third end; the two magneto-resistor elements being disposed between said first concentrating/shielding structure and said second flux concentrating/shielding structure; each line element from the array of line elements in each of the two magneto-resistor elements being substantially parallel to said first end and said third end.

28. The sensor of claim 27 wherein the two reference resistor elements and the two magneto-resistor elements connected to form a Wheatstone Bridge configuration, each of arm of the Wheatstone Bridge comprising one reference resistor and one magneto-resistor element; an output of the Wheatstone Bridge being provided by a voltage between points of connection of the reference resistor element and the magneto-resistor element in each arm of the Wheatstone Bridge.

29. The sensor of claim 27 wherein the two reference resistor elements are two other magneto-resistor elements.

30. The sensor of claim 27 wherein the first flux concentrating/shielding structure comprises a plurality of openings; a location of any opening from the plurality of openings not being a location in an area of the flux concentrating/shielding structure under which said one of the two reference resistor elements is disposed.

31. The sensor of claim 27 wherein the second flux concentrating/shielding structure comprises a plurality of openings; a location of any opening from the plurality of openings not being a location in an area of the flux concentrating/shielding structure under which said another of the two reference resistor elements is disposed.

32. The sensor of claim 27 wherein said flux concentrating/shielding subsystem also comprises a flux concentrating structure; said flux concentrating structure being disposed in a horizontal plane above said array of line elements and said first connecting elements and said second connecting elements;

said flux concentrating structure comprising:
    a first end;
    a second end; and
    a number of bars extending from at least one of the first end and the second end;
    each one bar from said number of bars being horizontally disposed between and substantially parallel to two line elements;
    a distance between said first end and said second end being longer than a longest distance between said first connecting elements and said second connecting elements.

33. The sensor of claim 32 wherein the number of bars extend from the first end to the second end.

34. The sensor of claim 32 wherein a first number of bars extend from and are connected to the first end and a second number of bars extend from and are connected to the second end; the first number of bars and the second number of bars forming an interdigitated structure.

* * * * *